United States Patent [19]

Kaneno et al.

[11] Patent Number: 4,591,464
[45] Date of Patent: May 27, 1986

[54] METHOD AND APPARATUS FOR EVAPORATING A LIQUID ORGANIC METAL

[75] Inventors: Nobuaki Kaneno; Kazuhisa Takahashi, both of Itami, Japan

[73] Assignee: Mitsubishi Denki Kabushiki Kaisha, Tokyo, Japan

[21] Appl. No.: 671,987

[22] Filed: Nov. 15, 1984

[30] Foreign Application Priority Data

Nov. 22, 1983 [JP] Japan .................................. 58-221101

[51] Int. Cl.$^4$ ................................................ B01F 3/04
[52] U.S. Cl. .................................. 261/153; 261/121 R
[58] Field of Search ........................... 261/121 R, 153

[56] References Cited

U.S. PATENT DOCUMENTS

| 1,530,882 | 3/1925 | Chapin ............................ 261/121 R |
| 3,306,835 | 2/1967 | Magnus ........................... 261/121 R |
| 3,735,568 | 5/1973 | Beck ................................ 261/121 R |
| 4,419,331 | 12/1983 | Montalvo ........................ 261/121 R |

FOREIGN PATENT DOCUMENTS

| 102640 | 4/1899 | Fed. Rep. of Germany ... 261/121 R |
| 2527 | of 1873 | United Kingdom ............ 261/121 R |

OTHER PUBLICATIONS

Alfa Products, "Organometallics for Vapor Phase Epitaxy", p. 39, 1983, Alpha Products, 152 Andover St., Danvers, Mass. 01923.

Samuelson et al., "Electrical and Optical Properties of Deep Levels in MOVPE Grown GaAs", Journal of Crystal Growth, 1981, pp. 164–172.

*Primary Examiner*—Tim Miles
*Attorney, Agent, or Firm*—Lowe, Price, LeBlanc, Becker & Shur

[57] ABSTRACT

A bubbling evaporator comprises: a vessel (11); a partition plate (11a) for dividing the vessel (11) into an upper chamber (11b) for temporarily storing carrier gas and a lower chamber (11c) for containing liquid (2); an inlet pipe (12 or 14) for making the carrier gas blow from the upper chamber (11b) into the liquid (2) in the lower chamber (11c) through the partition plate (11a) to bubble and evaporate the liquid (2); and an outlet pipe (13) for leading the evaporated vapor together with the carrier gas to the exterior of the vessel (11). Thus, backflow of the liquid (2) to the exterior of the vessel (11) can be prevented and stable pressure of the evaporated vapor can be obtained. A method of evaporating a liquid organic metal to be used in a vapor deposition process for manufacturing semiconductor devices and the like is also disclosed.

5 Claims, 3 Drawing Figures

METHOD AND APPARATUS FOR EVAPORATING A LIQUID ORGANIC METAL

BACKGROUND OF THE INVENTION

1. Field of the Invention

The present invention relates to a bubbling evaporator for supplying vapor evaporated from a liquid together with a carrier gas by making the carrier gas blow into the liquid to cause bubbling, and particularly relates to prevention of backflow of the liquid to the exterior of a bubbling vessel and stabilization of the evaporated vapor pressure.

2. Description of the Prior Art

In a process for manufacturing semiconductor devices and the like by utilizing vapor deposition, a liquid organic metal or the like liquid is caused to bubble by carrier gas so as to be evaporated and the vapor thus evaporated is supplied for the deposition, together with the carrier gas.

FIG. 1 is a vertical sectional view showing a structure of such a conventional bubbling evaporator. An evaporator shown in FIG. 1 comprises a vessel 1 for containing liquid 2 of an organic metal such as trimethylgallium (TMG) and an inlet pipe 4 for causing the liquid to bubble by a carrier gas such as hydrogen ($H_2$). In such an evaporator, the carrier gas blows through an inlet valve 3 and the inlet pipe 4 into the liquid 2 to cause bubbles. When these bubbles float up to the liquid surface, vapor evaporated from the liquid 2 is absorbed efficiently into the bubbles. The carrier gas including such evaporated vapor is supplied to a deposition station through an outlet valve 5.

However, if backpressure is applied in the vessel 1 of the above described evaporator, it might happen that the liquid 2 flows backward through the inlet pipe 4 to the valve 3 or any other arranged pipes outside the vessel 1 to remain there. Such liquid remaining outside the vessel 1 not only causes change of the evaporated vapor pressure but also involves danger at the time of removing the vessel 1 for maintenance since such liquid organic metal is generally inflammable. In addition, although the vessel 1 is generally disposed in a constant temperature bath for the purpose of controlling the evaporated vapor pressure, the temperature of the carrier gas is not stable enough and the temperature difference between the carrier gas and the liquid 2 is large since the carrier gas is sent directly into the liquid 2 through the pipe 4 from outside the vessel 1. Accordingly, the evaporated vapor pressure obtained is not sufficiently stable.

SUMMARY OF THE INVENTION

An object of the present invention is to eliminate the above described disadvantages of a conventional bubbling evaporator.

A bubbling evaporator in accordance with the present invention comprises a vessel divided by a partition plate into an upper chamber for temporarily storing carrier gas and a lower chamber for containing liquid. The vessel comprises an inlet pipe for making the carrier gas blow from the upper chamber into the liquid in the lower chamber through the partition plate to bubble and evaporate the liquid and an outlet pipe for leading the evaporated vapor together with the carrier gas to the exterior of the vessel.

A method of evaporating a liquid organic metal to be used in a vapor deposition process for manufacturing semiconductor devices and the like is also disclosed. The method comprises the steps of supplying a carrier gas into an upper chamber of a vessel containing liquid organic metal in a lower chamber thereof. The upper and lower chambers are maintained at substantially constant temperature. The carrier gas is directed from the upper chamber so that the gas passes directly into the liquid metal to bubble upward through the liquid so that when the bubbles float up to the liquid surface metal vapor evaporated from the liquid is absorbed into the bubbles. The bubbles containing evaporated liquid vapor are directed from a region in the lower chamber formed above the liquid into an outlet pipe for carrying the bubbles to a vapor deposition station. The carrier gas is initially directed into a bottom part of the upper chamber and allowed to flow upwards in the upper chamber prior to being supplied to the lower chamber. The upward flow of gas allows the gas a residence time in the upper chamber so as to approach the substantially constant temperature.

A bubbling evaporator in accordance with the present invention can prevent backflow of the liquid to the exterior of the vessel, and provides stable pressure of the evaporated vapor.

These objects and other objects, features, aspects and advantages of the present invention will become more apparent from the following detailed description of the present invention when taken in conjunction with the accompanying drawings.

DESCRIPTION OF THE EMBODIMENTS

Figure 1:
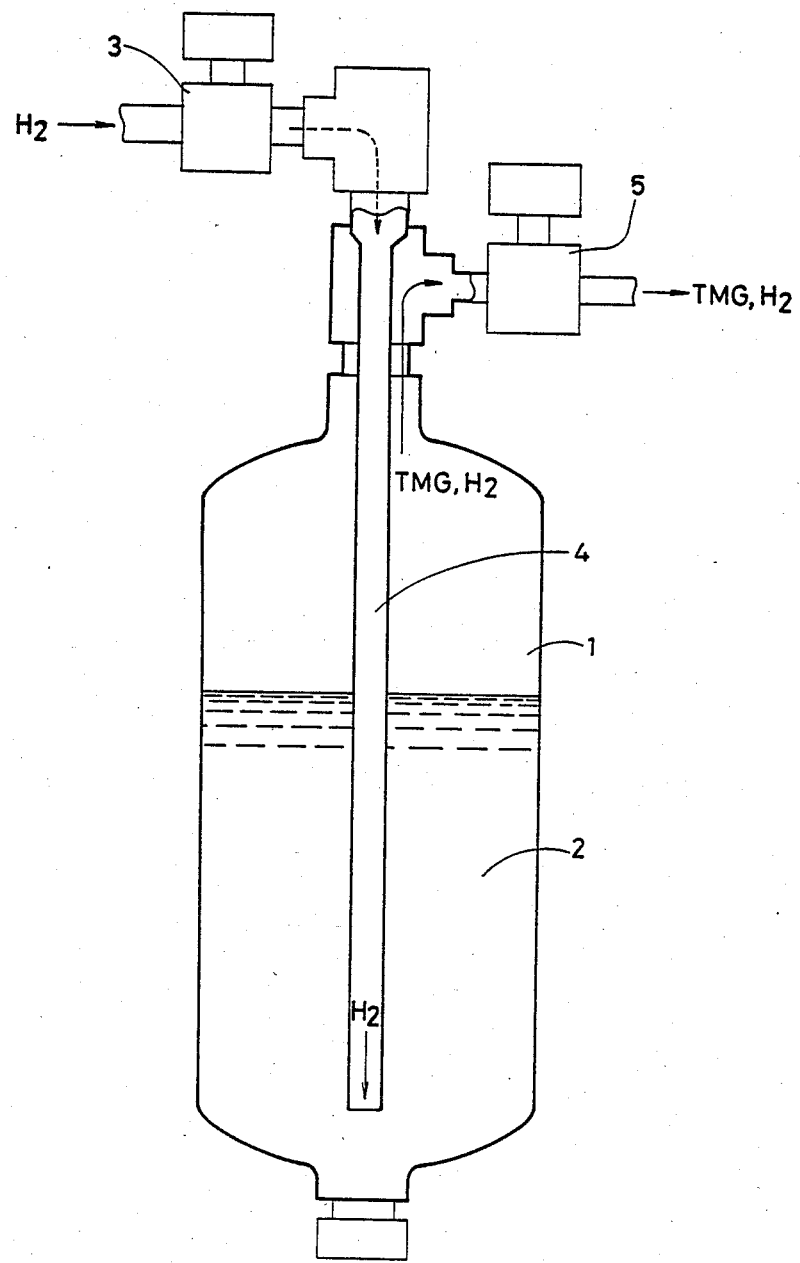
FIG. 1 is a vertical sectional view showing a structure of a conventional bubbling evaporator.
Figure 2:
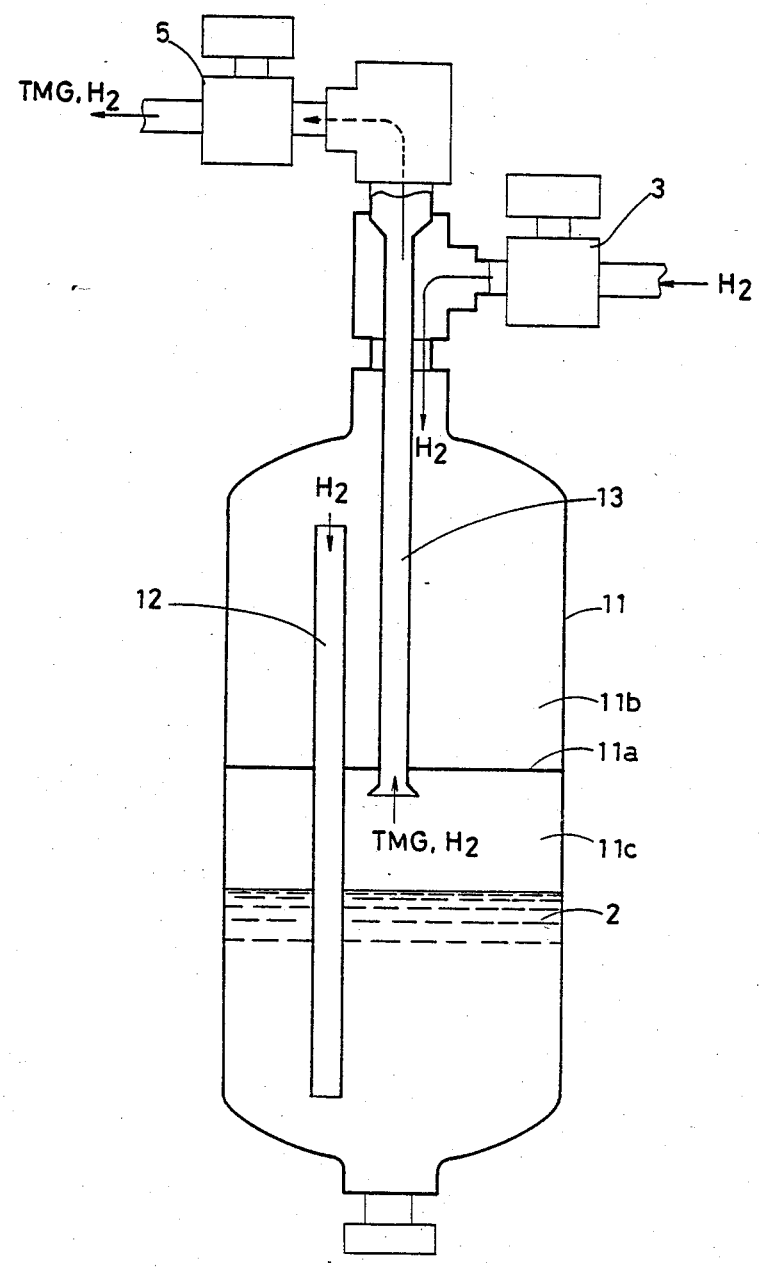
FIG. 2 is a vertical sectional view of a bubbling evaporator of an embodiment of the present invention.

FIG. 2 shows a vertical sectional view of a bubbling evaporator of an embodiment in accordance with the present invention. An inlet valve 3 and an outlet valve 5 shown with the evaporator in FIG. 2 are the same as those shown in FIG. 1. The evaporator of this embodiment comprises a vessel 11 divided by a partition plate 11a into an upper chamber 11b for temporarily storing carrier gas and a lower chamber 11c for containing liquid 2. The whole vessel 11 is disposed in a constant temperature bath (not shown). The vessel 11 further includes an inlet pipe 12 for making the carrier gas blow from the upper chamber 11b into the liquid in the lower chamber 11c through the partition plate 11a to bubble and evaporate the liquid and an outlet pipe 13 for leading the evaporated gas together with the carrier gas to the exterior of the vessel 11.

In the evaporator, the carrier gas supplied through the inlet valve 3 is temporarily stored in the upper chamber 11b. Then, the carrier gas temporarily stored in the upper chamber 11b blows into the liquid 2 penetrating the partition plate 11a by means of the inlet pipe 12 extending deeply into the liquid 2. Then, vapor evaporated from the liquid 2 through bubbling by the carrier gas is led together with the carrier gas to the exterior of the vessel 11 through the outlet pipe 13 and the outlet valve 5.

In this process, the temperature of the liquid 2 is maintained stable and the temperature of the carrier gas temporarily stored in the upper chamber 11b is also made approximately equal to the temperature of the liquid 2 since the vessel 11 is provided in a constant temperature bath (not shown). Accordingly, the temperatures of the liquid 2 and the carrier gas for bubbling become almost the same and are maintained stable. As a result, the evaporated vapor pressure obtained by the bubbling becomes stable.

Even if the liquid 2 flows backward through the inlet pipe 12 due to backpressure, the backflowing liquid remains in the upper chamber 11b and never reaches the valve 3 or any other arranged pipes outside the vessel 11. Accordingly, the above described disadvantages due to the backflow can be avoided.

Figure 3:
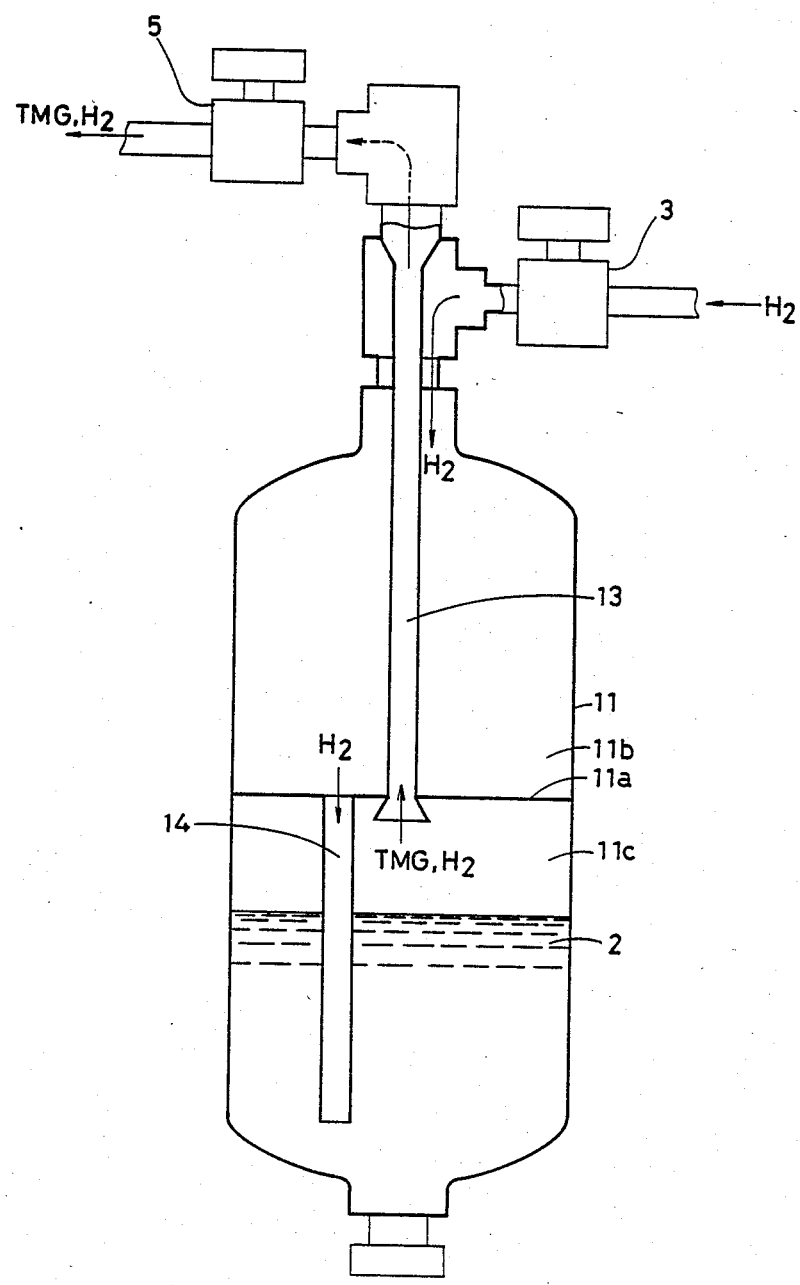
FIG. 3 is a vertical sectional view of a bubbling evaporator of another embodiment of the present invention.

FIG. 3 is a sectional view of a bubbling evaporator showing another embodiment of the present invention. This evaporator is the same as the evaporator shown in FIG. 2 except for an inlet pipe 14. The inlet pipe 14 does not protrude upward from the partition plate 11a as can be seen from the drawing. Accordingly, if the liquid 2 in this evaporator backflows into the upper chamber 11b through the inlet pipe 14 due to backpressure, the liquid pushed up to the upper chamber 11b returns to the lower chamber 11c through the same inlet pipe 14 after disappearance of the backpressure. That is, in this evaporator, even if the liquid 2 backflows due to backpressure temporarily applied for some reason, the liquid 2 entirely returns to the original state after disappearance of the backpressure.

Although as an example for applications of the bubbling evaporators of the above described embodiments, supply of organic metal vapor in a manufacturing process of semiconductor devices was described, it goes without saying that a bubbling evaporator in accordance with the present invention can also be applied to other various means utilizing vapor evaporated from liquid through bubbling.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bubbling evaporator for evaporating a liquid organic metal to be used in a vapor deposition process for manufacturing semiconductor devices and the like, said evaporator comprising:

a vessel (11) in a constant temperature bath, a partition plate (11a) for dividing said vessel (11) into an upper chamber (11b) for temporarily storing carrier gas and a lower chamber (11c) for containing liquid (2), means for admitting carrier gas into the upper chamber, an inlet pipe (12 or 14) for allowing said carrier gas to blow from said upper chamber (11b) into said liquid (2) in said lower chamber (11c) through said partition plate (11a) to bubble and evaporate said liquid (2), wherein said inlet pipe (12) has an upper end located above said partition plate and within the upper chamber, said upper end terminating within an upper region of the upper chamber, and an outlet pipe (13) for leading the evaporated vapor together with said carrier gas to the exterior of said vessel (11).

2. A bubbling evaporator in accordance with claim 1, wherein said outlet pipe (13) extends upward from said lower chamber through the upper chamber to the exterior of said vessel, passing approximately through the center of said upper chamber (11b).

3. The bubbling evaporator in accordance with claim 1, wherein said liquid is trimethylgallium and said carrier gas is hydrogen.

4. A method of evaporating a liquid organic metal to be used in a vapor deposition process for manufacturing semiconductor devices and the like, comprising the steps of supplying a carrier gas into an upper chamber of a vessel containing liquid organic metal in a lower chamber thereof, said upper and lower chambers being maintained at substantially constant temperature; directing said carrier gas from the upper chamber so that the gas passes directly into said liquid organic metal to bubble upward through the liquid so that when the bubbles float up to the liquid surface metal vapor evaporated from the liquid is absorbed into the bubbles; and directing said bubbles containing evaporated liquid vapor from a region in the lower chamber formed above the liquid into an outlet pipe for carrying said bubbles to a vapor deposition station, wherein said step of supplying said carrier gas into the upper chamber includes the further step of directing said carrier gas into a bottom part of the upper chamber and allowing said gas to flow upwards in the upper chamber prior to being supplied to the lower chamber, said upward flow of gas allowing the gas a residence time in the upper chamber so as to approach the constant temperature.

5. The method of claim 4, wherein said liquid is trimethylgallium and said carrier gas is hydrogen.

* * * * *